United States Patent [19]
Rodgers et al.

[11] Patent Number: 5,233,209
[45] Date of Patent: Aug. 3, 1993

[54] GUARD RING STRUCTURE WITH GRADED BE IMPLANTATION

[75] Inventors: Paul M. Rodgers; Michael J. Robertson, both of Ipwich; Julie J. Rimington, Woodbridge, all of England

[73] Assignee: BT&D Technologies Ltd., Suffolk, England

[21] Appl. No.: 820,630

[22] PCT Filed: Jun. 8, 1990

[86] PCT No.: PCT/GB90/00895
§ 371 Date: Jan. 24, 1992
§ 102(e) Date: Jan. 24, 1992

[87] PCT Pub. No.: WO90/15446
PCT Pub. Date: Dec. 13, 1990

[30] Foreign Application Priority Data
Jun. 8, 1989 [GB] United Kingdom ............... 8913198

[51] Int. Cl.$^5$ .................................. H01L 27/14
[52] U.S. Cl. ................. 257/171; 257/185; 257/186; 257/199; 257/438
[58] Field of Search ............ 357/30 A, 30 E, 30 R, 357/52, 52 D, 16, 90; 257/187, 192, 183, 438, 170, 171, 186, 611, 603, 199, 185

[56] References Cited
U.S. PATENT DOCUMENTS
4,415,370 11/1983 Kagawa et al. ............. 257/607 X FOREIGN PATENT DOCUMENTS
1195414 10/1985 Canada ......................... 357/30 A
0001139 3/1979 European Pat. Off. ....... 357/30 A
0251458 1/1988 European Pat. Off. ........ 357/30 A

OTHER PUBLICATIONS

Taguchi et al., "Planar InP/InGaAs Avalanche Photodiodes with Preferential Lateral Extended Guard Ring," *IEEE Electron Device Letters*, vol. EDL-7, No. 4, Apr. 1986, pp. 257-258.

Feng et al., "Be-Implanted 1.3-$\mu$m InGaAsP Avalanche Photodetectors", *Appl. Phys. Lett.* 34(9), May 1, 1979, pp. 591-593.

Shirai et al., "1.3 $\mu$m InP/InGaAsP Planar Avalanche Photodiodes", *Electronics Letters*, Oct. 29, 1981, vol. 17, No. 22, pp. 826-827.

Kol'tsov et al., "Electrophysical and the Photoelectric Characteristics of P-N Junctions Formed by Implantation of Beryllium in GaAs$_{1-x}$P$_x$", *Sov. Phys. Semicond.* 21(10); Oct. 1987, pp. 1152-1153.

Sakurai, "Optical Semiconductor Devices Operating in the 1 $\mu$m Wavelength Region," *Fujitsu Sci. Tech. J.*, 21, 1, pp. 19-30 (Mar. 1985).

*Primary Examiner*—William Mintel
*Attorney, Agent, or Firm*—Nixon & Vanderhye

[57] ABSTRACT

An avalanche photodiode having a beryllium guard ring. The beryllium is implanted at a dosage of at least $5 \times 10^{14}$ per cm$^2$ and subsequently annealed to provide a guard ring profile with a p+core and a superlinearly graded tail. The doping profile of the guard ring immediately adjacent the core is superlogarithmic.

7 Claims, 1 Drawing Sheet

GUARD RING STRUCTURE WITH GRADED BE IMPLANTATION

FIELD OF THE INVENTION

This invention relates to beryllium guard ring structures and fabrication thereof, and in particular to guard ring structures for avalanche photodiodes.

BACKGROUND OF THE INVENTION

In photodiodes (APD's), avalanche photocurrent is multiplied by impact ionisation of primary photogenerated carriers accelerated by a high field. In III-V APD devices for use at wavelengths in the regions of 1.3 and 1.5 microns a material such as indium gallium arsenide or suitable quanternary compounds may be used for the region where photogeneration occurs. If the multiplication also takes place in this material, which has a comparatively small band gap, high dark currents resulting from tunnelling occur at the high fields required for multiplication, giving rise to excessive noise. To avoid this problem the carrier pairs are photogenerated in indium gallium arsenide and then the holes are swept into a wider band gap indium phosphide layer containing the pn junction where avalanche multiplication takes place. This type of device is known as the separate absorption and multiplication (SAM) structure. A further modification is the SAGM which has a graded layer of intermediate composition (usually a quaternary) between the indium phosphide and indium gallium arsenide layers. The thickness and doping level of the indium phosphide multiplication layer has to be carefully controlled in order to achieve the correct field for avalanche multiplication near the pn junction, with a sufficiently low field at the interface with the indium gallium arsenide layer to avoid tunnelling. Both planar and mesa APD structures are known, and in general planar structures have proved superior, and are therefore preferred.

In planar APD devices the pn junction, which is generally formed by p+ implantation or diffusion into a nominally n type layer, will have a curved edge and is therefore subject to edge beakdown unless the boundary shape is modified to minimise the effects. Thus it is usual for a p type guard ring, also diffused or implanted, to be fabricated around the outer edges of the p type junction region. The structure and doping concentrations within the guard ring influence the extent to which edge breakdown is prevented.

SUMMARY OF THE INVENTION

Accordingly the present invention provides an avalanche photodiode comprising a semiconductor substrate, as n type light absorption layer, an n type indium phosphide multiplication layer, a p type region formed on the multiplication layer and providing an abrupt pn junction with the multiplication layer and a graded p type guard ring surrounding said p type region, characterised in that the guard ring comprises ion implanted beryllium at an implantation dosage of at least $5 \times 10^{14}$ per $cm^2$.

BRIEF DESCRIPTION OF THE DRAWINGS

The invention is now described by way of example with reference to the accompanying drawings in which.

DETAILED DESCRIPTION OF THE DRAWINGS

Figure 1:
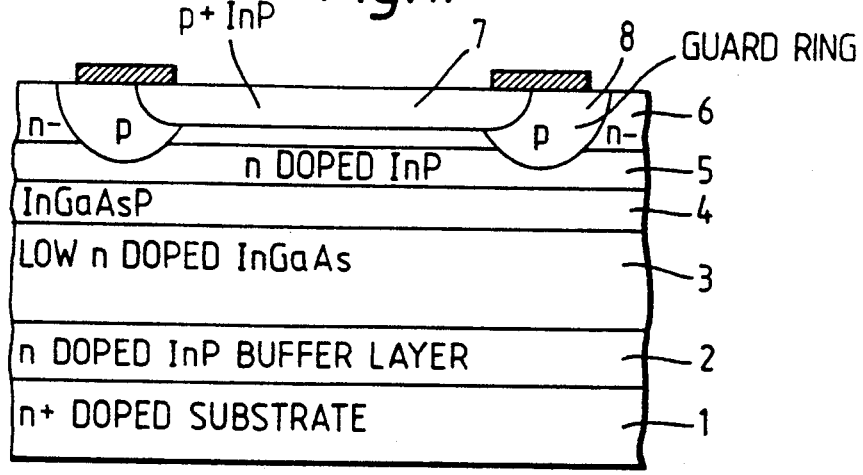
FIG. 1 is a schematic cross section through a SAGM APD with a guard ring.

Referring to FIG. 1, a preferred planar SAGM, APD structure is shown which comprises an n+ indium phosphide substrate 1, doped for example with sulphur to a level of $8 \times 10^{18}$ per cc. Over the substrate there is a 0.5 micron n type indium phosphide buffer layer 2, doped for example to a level of $10^{17}$ per cc, a 3 micron absorption layer of nominally undoped indium gallium arsenide 3 which in fact has a residual n type level of $10^{15}$ per cd and a 0.1 micron layer 4 of indium gallium arsenide phosphide with a 1.3 micron equivalent band gap. The layer 4 serves to grade the band gap between the layer 3 and the multiplication layer 5 while maintaining lattice match. Layer 5 comprises sulphur doped $10^{16}$ per cc indium phosphide and, overlying layer 5, is a final layer 6 of nominally undoped, actually $10^{15}$ per cc n type, indium phosphide. The indium phosphide layer 6 is of the order of 1 to 2 microns thick, and into its top surface a diffusion of zinc dopes a portion 7 p+ to a level of the order of $10^{18}$ per cc. The p+ diffusion preferably extends to a depth of about half of the layer 6 but may extend up to the interface with layer 5. Around the p+ region 7 (and in fact fabricated prior to it) a guard ring 8 of beryllium is provided by the technique described below.

The device layers 1 to 6, including the area into which zinc will subsequently be diffused are masked to define an implantation target zone and the target zone is implanted with beryllium ions with an energy in the range of 100 to 200 KeV to a dosage of at least $5 \times 10^{14}$ per $cm^2$ and preferably in the range of 2 to $4 \times 10^{15}$ per $cm^2$, most preferably $3 \times 10^{15}$ per $cm^2$. After implantation the device is annealed; preferably annealing is continued for about three hours at a temperature in the range of 625 to 750° C., most preferably for 3 hours at 700° C. To prevent loss of phosphorus from the device surface the annealing stage is conducted under flowing phosphine and hydrogen. Further protection may be provided by coating exposed surfaces with silicon nitride. The technique of annealing in an open tube with a flow of phosphine and hydrogen is found more convenient than sealing the device in an ampoule with red phosphorus. The layers are then remasked with the zinc diffusion region exposed and a zinc diffusion stage follows. Any suitable zinc diffusion technique may be utilised, for example a sealed ampoule technique with typical conditions of 20 minutes heating at 525° C. with a ZnAs source.

Figure 2:
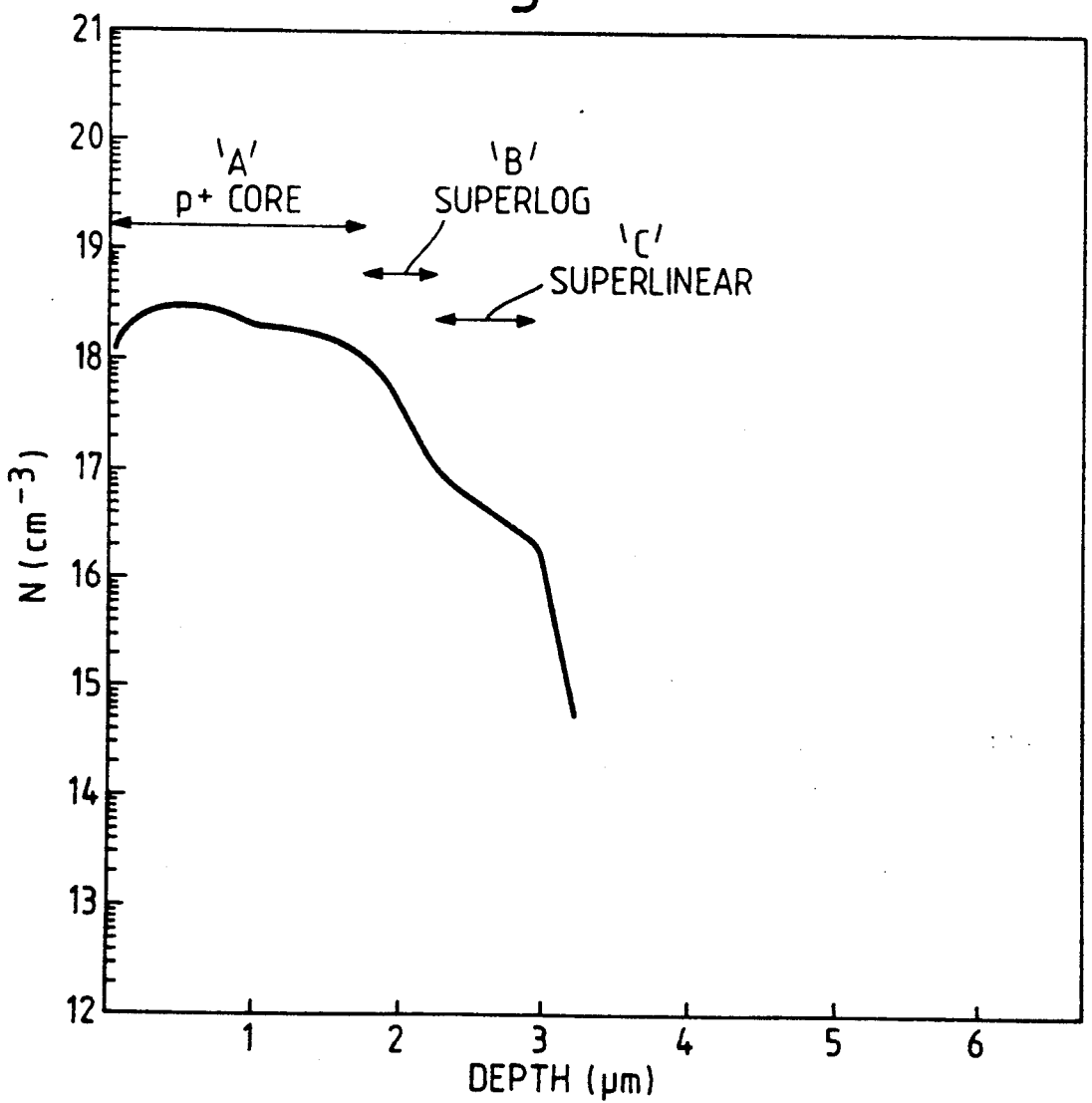
FIG. 2 is a graph showing the dopant profile of the guard ring.

FIG. 2 shows dopant concentration (plotted on a logarithmic scale) versus depth for a beryllium guard ring fabricated as described. It will be realised that the profile after implantation and before annealing will follow a substantially Gaussian distribution centred around a mean range that increases in depth with the implantation energy. Apart from relatively small difference in mean range and spread the resulting profiles after annealing are of substantially similar shape irrespective of implantation energy, the maximum mean range being less than 1 micron at 400 KeV and about 0.5 microns at 200 KeV with correspondingly wider spreads are also being obtained at higher implantation energy. The profile shown in FIG. 2 may conveniently be divided into three sections. The first section 'A' denotes a p+ core region extending from the surface of comparatively high doping level. This region 'A' extends deeper than the main junction depth and to a depth generally of the order of 1 to 2 microns. After the p+ region 'A' the beryllium concentration level begins to fall off at a superlogarithmic rate as shown in zone 'B' which may typically extend for up to one micron and is followed by a lower rate superlinear fall off 'C' for about 1 to 1.5 microns, after which the profile falls to an abrupt tail.

The superlinear guard ring region should have a doping level gradient which decreases continuously from the surface such that the average slope over the thickness of the multiplication layer is less than $5 \times 10^{16}$ cm$^{-3}$ $\mu^{-1}$, more preferably less than $3 \times 10^{16}$ cm$^{-3}\mu$m$^{-1}$ and most preferably less than $1 \times 10^{16}$ cm$^{-3}\mu$m$^{-1}$.

The superlogarithmic guard ring region should have a gradient of the log of the doping level which decreases continuously from the surface such that the average slope of the log doping over the thickness of zone B is less than 3 decades $\mu$m$^{-1}$, and greater than 0.5 decades $\mu$m$^{-1}$, most preferably about 1.5 decades $\mu$m$^{-1}$.

The profile obtained is surprising in view of reported work on beryllium doping of n-type indium phosphide (Devlin et al, Inst. Phys. Conf. Ser. No. 45: Chapter 6 pp 510–518) in which for lower dosages of implanted beryllium smoothly reducing dopant profiles were obtained. It was also further thought that dosages as high as $3 \times 10^{15}$ per cm$^2$ would result in excessive damage to the crystal structure (Slater et. al. Nuclear Instrumentation Methods B 7/8, p 429, 1985).

The guard ring structure provided by the high dosage beryllium implant and subsequent annealing approximates closely to the requirements of an ideal guard ring which are generally:

a laterally and vertically graded junction with sufficiently low doping gradient to reduce field enhancement due to edge curvature, and a guard ring junction depth greater than and laterally beyond the main p+n junction in order to suppress the field enhancement at the curved edge of the main junction. More specifically, the ideal guard ring should provide a higher p+ core region (the 'A' region) near to the surface to prevent back depletion to the main p+n junction and also to suppress curved edge field enhancement; as well as permitting sufficient back depletion into the p type guard ring to prevent significant enhancement of the electric field in the ternary absorption layer (which would result in tunnelling current); and avoiding abrupt changes in doping concentration within the depletion region to prevent local enhancement of electric field. Such an ideal guard ring also avoids significant p-type doping of the ternary absorption layer to prevent tunnelling current, because the dopant concentration rapidly falls to a low value in the absorption layer.

It should be particularly noted that outside the p+ core region 'A' the dopant distribution reduces smoothly and continuously without discontinuity, the low doping gradient in the superlinear region 'c' providing a graded pn junction in the multiplication layer without the very wide depletion widths associated with a linearly graded junction.

It is found that the shape of the doping gradient is determined by implant dose and does not depend upon anneal time or temperature. An implant dosage of $2 \times 10^{14}$ per cm$^2$ does not result, after annealing, in the desired profile. The doping profile is obtained early in the annealing process (as early as 15 minutes) but at that stage there is still residual implantation damage which reduces with increasing anneal time. For practical purposes an annealing time in the range of 30 minutes to 4 hours is preferred, most preferably about 3 hours.

Advantages given by the high dosage beryllium implanted guard ring over existing guard ring structures are that the doping profile renders the position of the guard ring much less critical, the insensitivity to annealing conditions enables high reproducibility and the superlinear region of the doping profile allows a more compact guard ring structure than linearly graded structures.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. An avalanche photodiode comprising a semiconductor substrate, an n type light absorption layer, an n type indium phosphide multiplication layer, a p type region formed on the multiplication layer and providing an abrupt pn junction with the multiplication layer and a graded p type guard ring surrounding said p type region, said guard ring including ion implanted beryllium at an implantation dosage of at least $5 \times 10^{14}$ per cm$^2$ such that after annealing the guard ring structure has in addition to a first portion of a first doping level near the surface of the multiplication layer, a second portion adjoining and below the first section in which the doping level decreases at a relatively high rate followed by a third portion adjoining and below the second portion in which the doping level decreases more slowly than in said second portion.

2. An avalanche photodiode according to claim 1 wherein the guard ring is subsequently annealed to provide a p+ core region extending to at least the depth of the abrupt pn junction and a graded region with a superlinear doping profile extending through the multiplication layer beyond the abrupt junction.

3. An avalanche photodiode according to claim 2 in which the doping profile of the graded region comprises a region adjacent the core having a superlogarithmic doping profile.

4. An avalanche photodiode according to claim 1 in which the implantation dosage is in the range of 2 to $4 \times 10^{15}$ per cm$^2$.

5. An avalanche diode as claimed in claim 1 in which the decrease of the doping level in said second portion has an average slope of less than 3 decades per $\mu$m and greater than 0.5 decades per $\mu$m.

6. An avalanche diode as claimed in claim 1 in which the decrease of the doping level in said third portion is less than $5 \times 10^{16}$cm$^{-3}\mu$m$^{-1}$.

7. An avalanche photodiode comprising a semiconductor substrate, an n type light absorption layer, an n type indium phosphide multiplication layer, a p type region formed on the multiplication layer and providing an abrupt pn junction with the multiplication layer and a graded p type guard ring surrounding said p type region, said guard ring including ion implanted beryllium at an implantation dosage of at least $5 \times 10^{14}$ per cm$^2$ and having a doping profile extending from a surface of the p type region through the pn junction which includes a superlogarithmic portion followed by a superlinear portion.

* * * * *